US008314714B2

(12) United States Patent
Pichard et al.

(10) Patent No.: US 8,314,714 B2
(45) Date of Patent: Nov. 20, 2012

(54) METHOD AND DEVICE FOR MANUAL TRIGGERING

(75) Inventors: Laurent Pichard, Frichemesnil (FR); Stéphane Di Marco, Cergy-Pontoise (FR); Christophe Bonazzi, Bourg-la-Reine (FR)

(73) Assignee: Finsecur, Nanterre (FR)

( * ) Notice: Subject to any disclaimer, the term of this patent is extended or adjusted under 35 U.S.C. 154(b) by 1222 days.

(21) Appl. No.: 11/791,034

(22) PCT Filed: Nov. 18, 2005

(86) PCT No.: PCT/FR2005/002875

§ 371 (c)(1), (2), (4) Date: Apr. 14, 2008

(87) PCT Pub. No.: WO2006/053990

PCT Pub. Date: May 26, 2006

(65) Prior Publication Data

US 2009/0027220 A1 Jan. 29, 2009

(30) Foreign Application Priority Data

Nov. 18, 2004 (FR) ..................................... 04 12229

(51) Int. Cl.

| | |
|---|---|
| ***E05B 13/08*** | (2006.01) |
| ***G08B 13/18*** | (2006.01) |
| ***G08B 13/14*** | (2006.01) |
| ***G08B 21/00*** | (2006.01) |
| ***G08B 17/12*** | (2006.01) |
| ***G06F 3/041*** | (2006.01) |
| ***G06F 3/042*** | (2006.01) |
| ***H03K 17/94*** | (2006.01) |

(52) U.S. Cl. ..................... 340/665; 340/600; 340/545.3; 340/551; 340/552; 340/686.1; 345/173; 345/175; 341/31; 341/34

(58) Field of Classification Search ........................ None
See application file for complete search history.

(56) References Cited

U.S. PATENT DOCUMENTS

| | | | | |
|---|---|---|---|---|
| 3,603,982 | A * | 9/1971 | Patti | 341/31 |
| 4,159,183 | A * | 6/1979 | Johannsen | 400/477 |
| 5,311,175 | A * | 5/1994 | Waldman | 341/34 |
| 6,411,215 | B1 | 6/2002 | Shnier | |
| 6,741,189 | B1 * | 5/2004 | Gibbons et al. | 341/31 |
| 7,053,799 | B2 * | 5/2006 | Yu et al. | 341/31 |
| 7,129,854 | B2 * | 10/2006 | Arneson et al. | 341/34 |
| 7,504,967 | B2 * | 3/2009 | Griffin | 341/22 |
| 7,583,206 | B2 * | 9/2009 | Volckers | 341/23 |

FOREIGN PATENT DOCUMENTS

| | | |
|---|---|---|
| WO | 01/11585 | 2/2001 |

* cited by examiner

*Primary Examiner* — Julie Lieu
(74) *Attorney, Agent, or Firm* — Young & Thompson

(57) ABSTRACT

The manual trigger device includes:
- a housing presenting a flexible or mobile surface,
- an emission unit that emits an electromagnetic field,
- a reception unit that receives the electromagnetic field, and emits a signal representative of the electromagnetic field received,
- a modulation element that modulates the electromagnetic field, and is connected to the flexible or mobile surface of the housing such that when the surface is deformed or moved, the reception unit receives an electromagnetic field modulated by the modulation element according to the deformation of the flexible or mobile surface and
- a processing circuit that processes the signal, and adapted to detect a modulation of the electromagnetic field representative of a push on the surface with a predetermined pressure and to command, upon detection, the change in appearance of a warning device visible from the outside of the housing.

18 Claims, 5 Drawing Sheets

METHOD AND DEVICE FOR MANUAL TRIGGERING

BACKGROUND OF THE INVENTION

1. Field of the Invention

Figure 1:
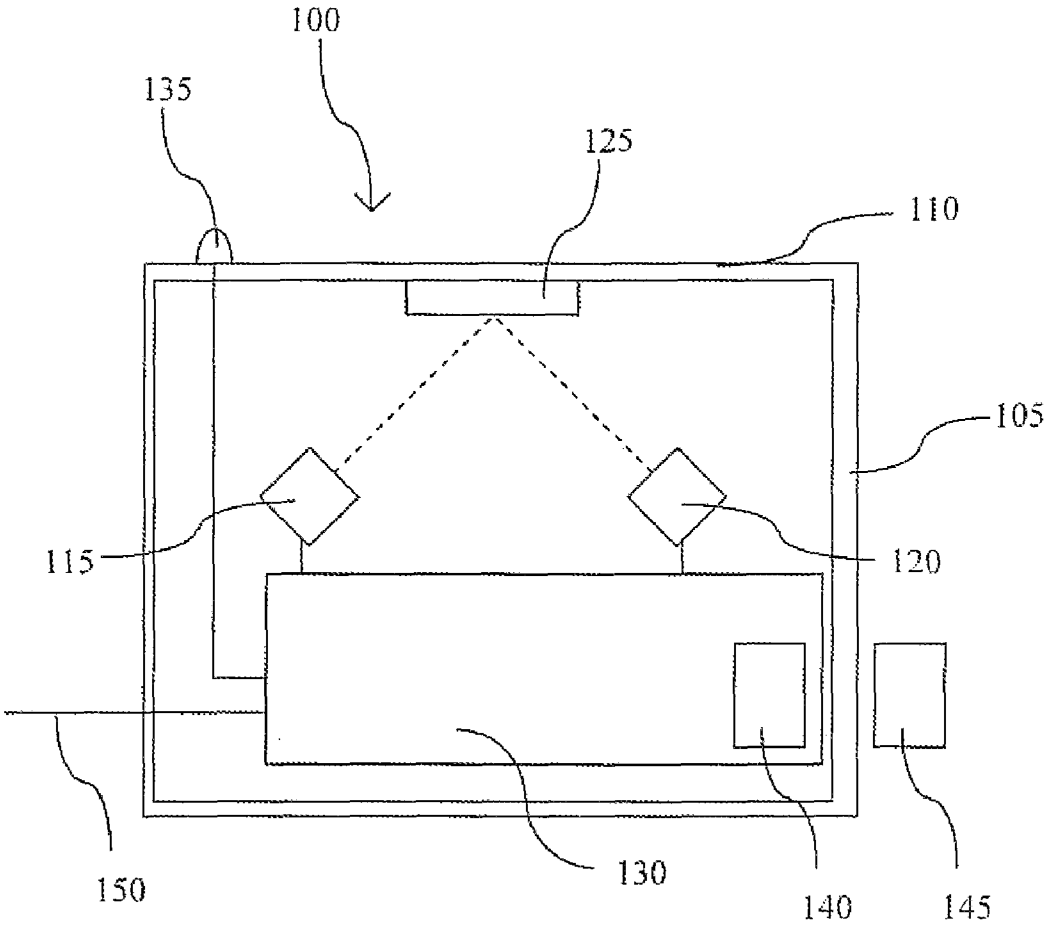

This invention concerns a manual trigger method and a manual trigger device. It applies, in particular, to the fire safety systems known as manual trigger or "break-glass" devices with which any user whatsoever can activate an alarm, especially in fire detection systems.

2. Description of the Related Art

Currently known electrical break-glass triggers operate in the following way: when a user presses on a window of the trigger, this surface is deformed and causes an electrical contact from an electrical contactor placed behind this surface. In addition, a mechanical element changes position in order to block the trigger. This mechanical trigger displays a message to the user informing him or her that his or her action has been registered.

This type of trigger presents a number of drawbacks.

Firstly, it is necessary for an operator to physically go to the trigger to manually reset it by using a special key. This intervention takes time and safeguarding the key poses problems in the long term.

Secondly, this type of trigger cannot be tested without causing it to be activated manually. This action takes time and can only rarely be performed. Finally, these triggers cannot emit an electrical fault nor monitor the line connecting them to a central monitoring station.

SUMMARY OF THE INVENTION

This invention intends to remedy these inconveniences.

To this end, the present invention envisages, according to a first aspect, a manual trigger device, characterized in that it comprises:

- a housing presenting a flexible or mobile surface,
- an emission means that emits an electromagnetic field,
- a reception means that receives the electromagnetic field emitted by the emission means adapted to emit a signal representative of the electromagnetic field it receives,
- a modulation means that modulates the electromagnetic field emitted by the emission means connected to the flexible or mobile surface of the housing in order that, when the flexible or mobile surface is deformed or moved, the reception means receives an electromagnetic field modulated by the modulation means according to the deformation of the flexible or mobile surface and
- a processing circuit that processes the signal emitted by the reception means adapted to detect a modulation of the electromagnetic field representative of a push on the flexible or mobile surface with a predetermined pressure and to command, once detection has occurred, the change in appearance of a warning device visible from the outside of the housing.

Thanks to these provisions, it is not necessary to physically go to the trigger in order to reset it. In addition, resetting does not require a special key. Finally, it is possible to test the working of the trigger device, by controlling the electromagnetic field emitted by the emission means and/or the signals emitted by the reception means and processing said signals.

According to particular features, the modulation means is adapted to continuously modulate the electromagnetic field emitted by the emission means in order that, when the flexible or mobile surface is deformed or moved, the reception means receives an electromagnetic field continually modulated by the modulation means.

Thanks to these provisions, a possible malfunction of the device can be detected and the sensitivity of the device can be checked and, possibly, modified.

According to particular features, the emission means and the reception means jointly form a condenser, the deformation of the flexible or mobile surface modifying the electrical properties of said condenser and varying its capacitance.

Thanks to these provisions, it is not necessary to utilize a transducer, for example electro-optical or opto-electronic.

According to particular features, the electromagnetic field is a propagation of light, the device as briefly described above comprising:

- an emission means that emits light rays,
- a reception means that receives light rays emitted by the emission means adapted to emit a signal representative of the light rays it receives,
- a modulation means that modulates the light rays emitted by the emission means connected to the flexible or mobile surface of the housing in order that, when the flexible or mobile surface is deformed or moved, the light rays reception means receives light rays modulated by the modulation means and
- a processing circuit that processes the signal emitted by the light rays reception means adapted to detect a modulation of the light rays representative of a push on the flexible or mobile surface with a predetermined pressure and to command, once detection has occurred, the change in appearance of a warning device visible from the outside of the housing.

According to particular features, the modulation means is adapted to continuously modulate the light rays emitted by the emission means in order that, when the flexible or mobile surface is deformed or moved, the light rays reception means receives light rays continually modulated by the modulation means.

Thanks to these provisions, a possible malfunction of the device can be detected and the sensitivity of the device can be checked and, possibly, modified.

According to particular features, the light rays emission means comprises a light-emitting diode.

Thanks to these provisions, the heating of the device is limited and its service life is very high.

According to particular features, the light rays modulation means comprises the interior surface of the flexible or mobile surface, an interior surface on which the light rays emitted by the emission means are reflected towards the reception means.

Thanks to these provisions, the detection of the surface's deformation or movement is simplified.

According to particular features, the light rays modulation means comprises an opaque component set in movement by the deformation or displacement of the flexible or mobile surface in order to be positioned between the light rays emission means and the light rays reception means.

Thanks to these provisions, the detection of the deformation or movement of the front surface is simplified and the gap between the emission means and the reception means can be very narrow, which limits the risks of disturbance by external movement, dust or pieces.

According to particular features, the reception means comprises a photosensitive semi-conductor component.

Thanks to these provisions, a photodiode or a phototransistor can be utilized and the reception means is sensitive and has a long service life.

According to particular features, the processing circuit is adapted to command the change in the state of the warning device after emitting an alert message to a central station and receiving a message acknowledging receipt from the central station.

Thanks to these provisions, the user can be sure that the alarm has been transmitted to the central station.

According to particular features, the processing circuit comprises a magnetic means adapted to change configuration during activation and to reset the device and resume its initial configuration when a magnetic key is utilized.

According to particular features, the warning device is mechanically linked to the magnetic means.

Thanks to these provisions, only the magnetic key allows the device to be reset.

According to particular features, the processing circuit is adapted to communicate with a central station and to receive a reset instruction from the central station, the processing circuit being adapted to reset itself and set the warning device to its initial appearance on reception of the reset instruction.

Thanks to these provisions, the resetting can be controlled remotely, through the intermediary of a wire or wireless connection, which reduces the elapsed time in resetting the device.

According to particular features, the signal processing circuit is adapted to measure the length of time elapsed since a manual activation, then to reset and return the warning device to its initial appearance when said length of time is greater than a predetermined length of time.

Thanks to these provisions, resetting can occur after a length of time considered sufficient for the emergency services to have been warned of the alarm and so that, if it was a false alarm, the device can be operational for a new alarm as quickly as possible, following a delay or programming.

According to particular features, the signal processing circuit is adapted to test the reception of light rays by the reception means and, if there is no reception, to emit an alert signal indicating a malfunction of the device.

Thanks to these provisions, a possible malfunction of the device can be detected, which increases the safety of buildings, goods and people.

According to particular features, the signal processing circuit is adapted to measure the length of time of a manual activation, then to reset and return the warning device to its initial appearance when said length of time is greater than a predetermined length of time.

Thanks to these provisions, resetting the device can be performed by inducing an activation of long duration, for example, at least ten seconds.

According to particular features, the signal processing circuit is adapted to detect a modulation of the light rays representative of a pull on the flexible or mobile surface with predetermined pull strength and to reset and return the warning device to its initial appearance when detection of the pull has occurred.

Thanks to these provisions, resetting the device can be performed by pulling on the front surface, for example, with a suction pad.

The present invention envisages, according to a second aspect, a manual trigger method, characterized in that it comprises:

- a step of emitting an electromagnetic field,
- a step of receiving the electromagnetic field emitted during the emitting step, during which a signal is emitted representative of the magnetic field received,
- a step of modulating the emitted electromagnetic field in order that, when the flexible or mobile surface is deformed or moved, the signal emitted during the reception step is modulated and
- a step of processing the signal representative of the electromagnetic field received in order to detect a modulation of the electromagnetic field representative of a push on the flexible or mobile surface with a predetermined pressure and to command, once detection has occurred, the change in appearance of a warning device visible from the outside of the housing.

According to particular features, the electromagnetic field is a propagation of light, the method as briefly described above comprising:

- a step of emitting light rays,
- a step of receiving the light rays emitted during the emitting step, during which a signal is emitted representative of the light rays received,
- a step of modulating the emitted light rays in order that, when the flexible or mobile surface is deformed or moved, the signal emitted during the reception step is modulated and
- a step of processing the signal representative of the light rays received in order to detect a modulation of light rays representative of a push on the flexible or mobile surface with a predetermined pressure and to command, once detection has occurred, the change in appearance of a warning device visible from the outside of the housing.

As the particular features, advantages and aims of the method are similar to those of the device as briefly described above, they are not repeated here.

BRIEF DESCRIPTION OF THE DRAWING FIGURES

Figure 2:
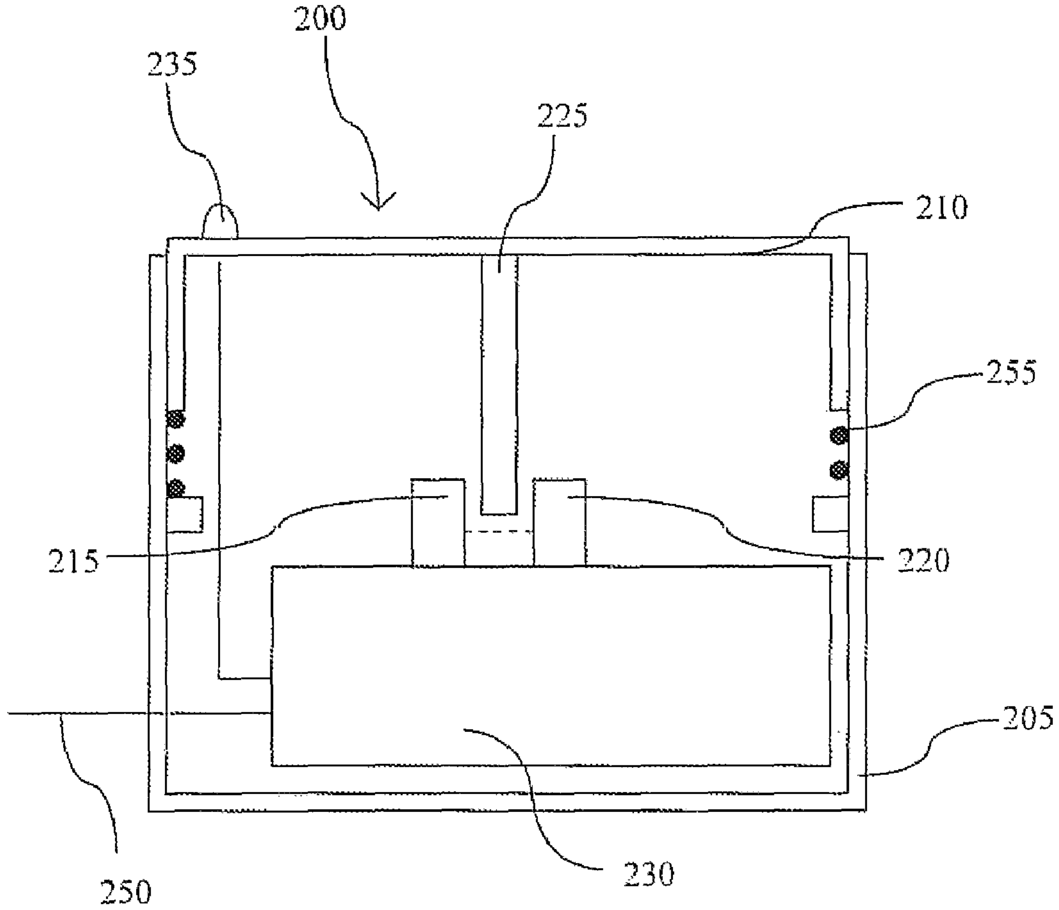
Figure 3:
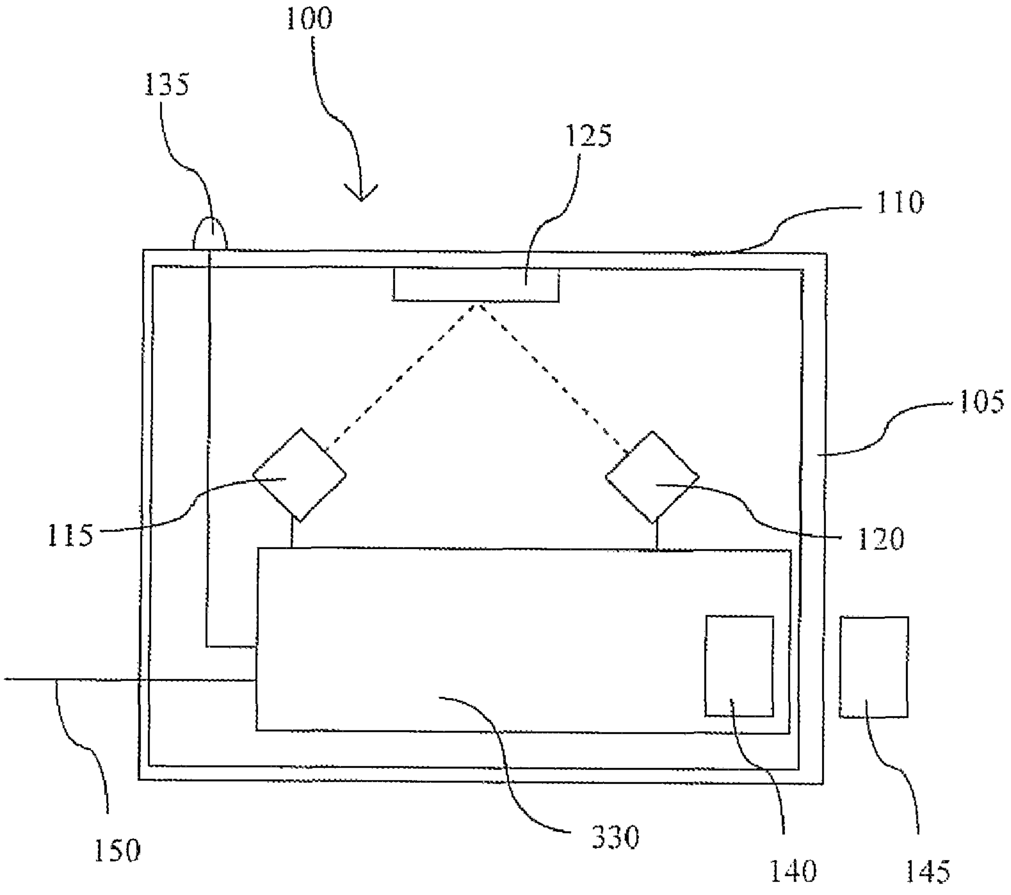
Figure 4:
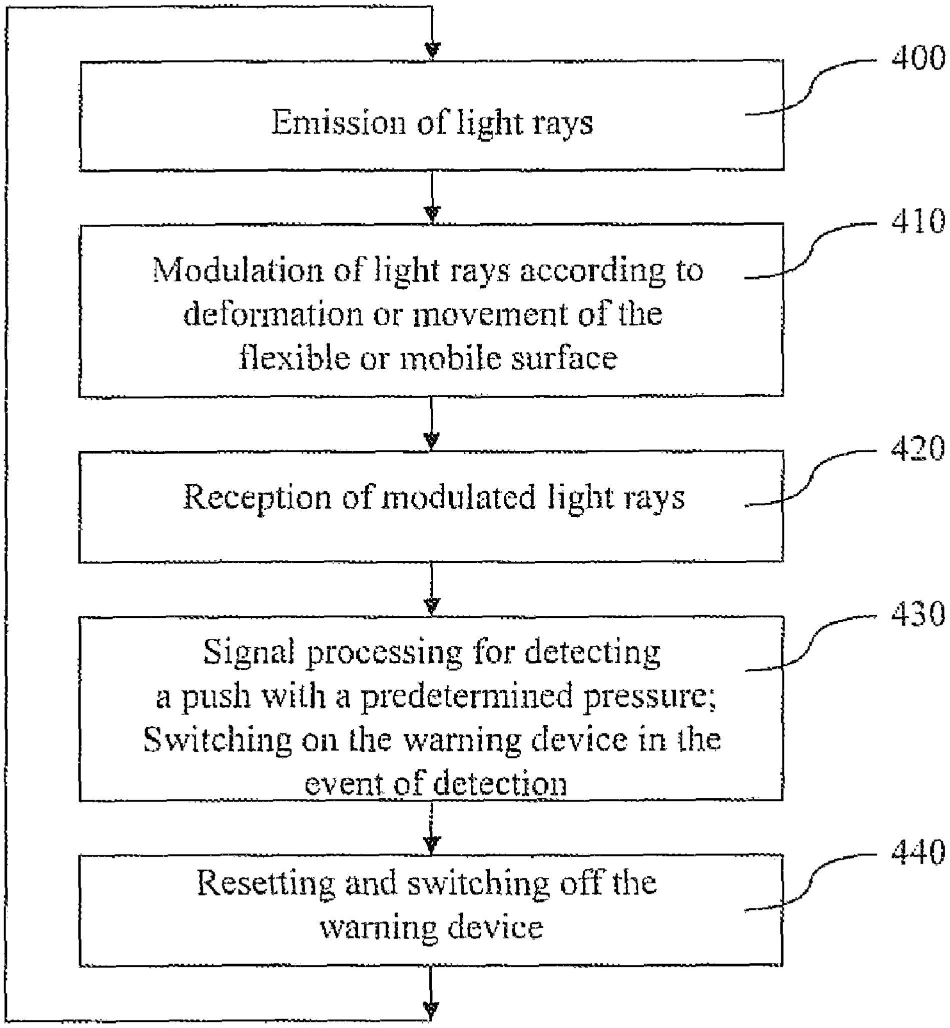
Figure 5:
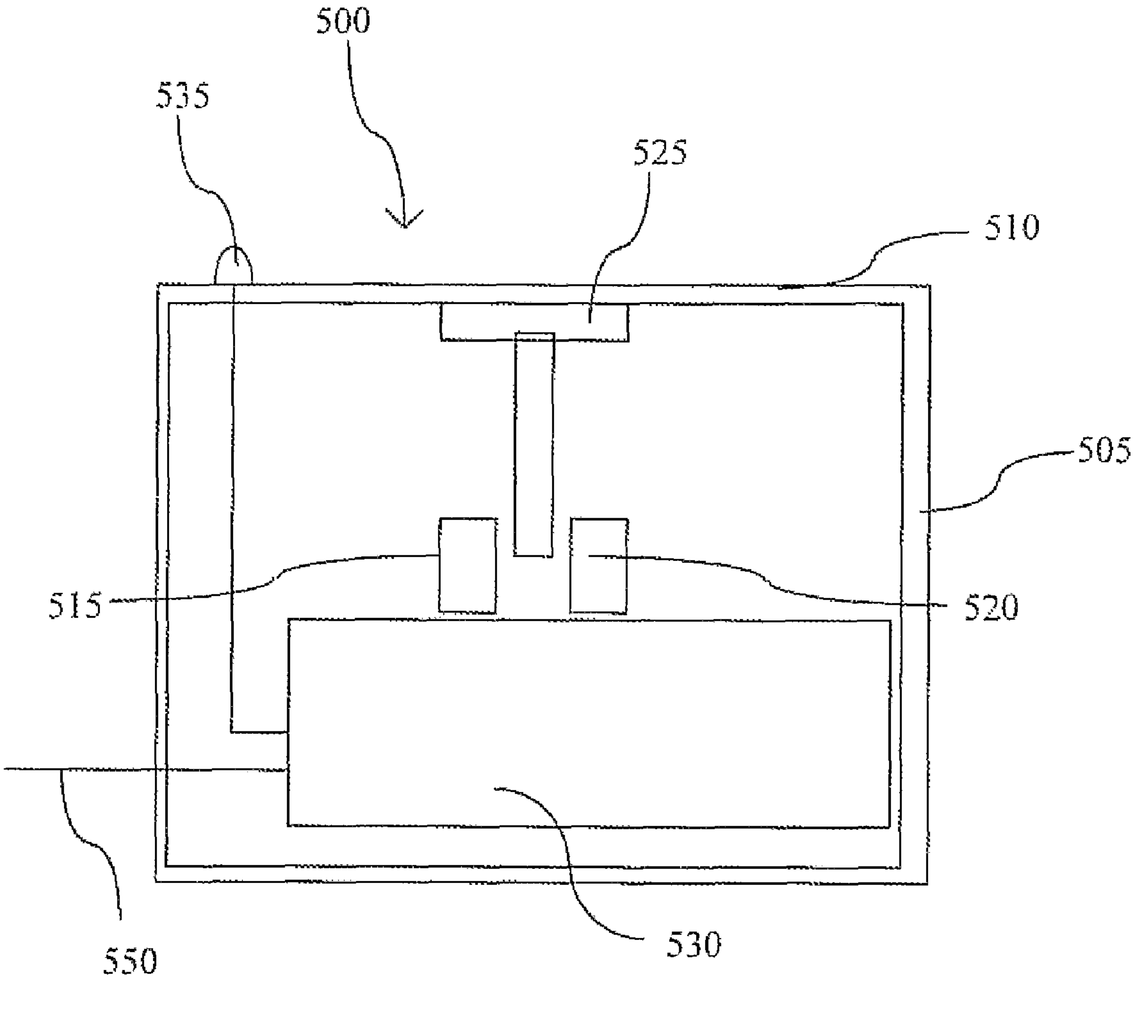

Other advantages, aims and characteristics of the present invention will become apparent from the description that will follow, made with reference to the accompanying drawings, in which:

FIG. 1 represents, schematically, in cross-section, a manual trigger device according to a first embodiment of the present invention, FIG. 2 represents, schematically, in cross-section, a manual trigger device according to a second embodiment of the present invention, FIG. 3 represents, schematically, in cross-section, a manual trigger device according to a third embodiment of the present invention, FIG. 4 represents, in the form of a logical diagram, a particular embodiment of the method that is the subject of the present invention and FIG. 5 represents, schematically, in cross-section, a manual trigger device according to a first embodiment of the present invention,

DETAILED DESCRIPTION OF THE INVENTION

Even though the following description is, as an illustration of at least one embodiment of the present invention, limited to the case of a fire detection system, the scope of the present invention encompasses all manual trigger systems, whatever the action that they trigger.

FIG. 1 shows a manual trigger device 100 comprising:

- a housing 105 presenting a flexible or mobile surface 110,
- a light rays emission means 115, a light rays reception means 120 that receives light rays emitted by the emission means 115 adapted to emit a signal representative of the light rays it receives, a modulation means 125 that modulates the light rays emitted by the emission means connected to the surface 110 in order that, when the surface 110 is deformed or moved, the reception means 120 receives light rays modulated by the modulation means 125 and a processing circuit 130 that processes the signal emitted by the light rays reception means 120 adapted to detect a modulation of the light rays representative of a push on the surface 110 with a predetermined pressure and a warning device 135 visible from the outside of the housing 105 controlled by the processing circuit 130.

The housing 105 is of a known type. It is connected to a central station (not shown), through the intermediary of a wire or wireless connection 150. It is generally fixed on a wall. The surface 110 is, in this embodiment, flexible and elastic and constitutes, preferentially, all or part of the front surface of the housing 105.

The light rays emission means 115 comprises, preferentially, a light-emitting semi-conductor component, for example a light-emitting diode.

The reception means 120 comprises, preferentially, a light-sensitive semi-conductor component, for example a photodiode or phototransistor, which emits a signal representative of the light rays it receives.

Between the emission means 115 and reception means 120, the modulation means 125 comprises, here, the interior surface of the housing 105 of the surface 110 on which the light rays emitted by the light-emitting diode 115 are reflected.

When the surface 110 is deformed or moved, the light rays reception means 120 receives light rays modulated by the modulation means 125. As a result of the geometry of the positions of the light-emitting diode 115, the reflecting surface of the interior surface and the position of the reception means 120, the intensity of the signal coming out of the reception means 120 is greatest when there has been no push on the surface 110. When there is a push on this surface 110, the modulation is a reduction in the intensity of light received by the reception means 120 and, consequently, a reduction in the intensity of the electrical signal coming from the reception means 120. This reduction having a unique relationship to the deformation of the surface 110, the processing circuit 130 of the signal coming from the reception means can measure the force exerted on the front surface and trigger an alarm signal transmitted to the central station 150 when the intensity of the signal transmitted by the reception means 120 becomes less than a predetermined value corresponding to a standardized pressure (in accordance with the regulations in force, for example European regulations).

To avoid any disturbance from stray light, the light emitted by the light-emitting diode 115 is preferentially variable, for example in the form of pulses, i.e. the intensity of light takes two values alternately, for example zero and nominal. Thus, the processing circuit 130 can measure the stray light and deduct it from the light received.

Once an alarm signal has been transmitted to the central station 150, the processing circuit 130 waits to receive, from the central station 150, a signal acknowledging receipt of the alarm and then triggers a change to the visible state of the warning device 135. For example, the warning device 135 is a light-emitting diode located on the front surface of the housing 105 that is lit intermittently by the processing circuit 130 after receipt of the acknowledgement of receipt from the central station 150.

For resetting, in the embodiment shown in FIG. 1, in the processing circuit 130, there is provided a magnetic component 140, known under the name flexible plate switch, which changes configuration on detection of a push of a predetermined pressure on the surface 110 or on reception of the signal acknowledging receipt from the central station 150 and a magnetic key 145 which is needed to return this magnetic component 140 to the initial state.

Possibly, it is the magnetic component 140 that controls the state of the warning device 135, for example by closing a power supply circuit for this warning device.

The signal processing circuit 130 is adapted to test the reception of light rays by the reception means 120. To this end, the signal processing circuit modulates, during test phases, for example daily, the power-supply signal of the light-emitting diode 115, for example in the form of saw-tooth wave signals and measures the intensity of the signal emitted by the reception means 120. When the drift of the phototransistor's response (peak value) and the impact of the stray light (minimum value of the intensity of the signal emitted by the reception means) are limited (for example, less than one-thirds), the processing circuit 130 can compensate for this drift by modifying the detection threshold. However, when the drift or the impact of the stray light is greater than a predetermined value, for example one-third, the processing circuit 130 emits a signal, to the central station 150, indicating a malfunction of the manual trigger device 100.

It is noted that the increase in the impact of the stray light can be caused by a fracture of the housing 105 or the surface 110 while the drift of the device's response can be caused by the presence of dust in the optical system.

FIG. 2 shows a manual trigger device 200 comprising:

a housing 205 presenting a mobile surface 210, a light rays emission means that emits light rays 215, a light rays reception means 220 that receives light rays emitted by the emission means 215 adapted to emit a signal representative of the light rays it receives, a modulation means 225 that modulates the light rays emitted by the emission means connected to the surface 210 in order that, when the surface 210 is moved, the light rays reception means 220 receives light rays modulated by the modulation means 225 and a processing circuit 230 that processes the signal emitted by the light rays reception means 220 adapted to detect a modulation of the light rays representative of a push on the surface 210 with a predetermined pressure and a warning device 235 visible from the outside of the housing 205 controlled by the processing circuit 230.

The housing 205 is of a known type. It is connected to a central station (not shown), through the intermediary of a wire or wireless connection 250. It is generally fixed on a wall. The surface 210 is, in this embodiment, mobile in translation or in rotation along or around, respectively, an axis of rotation parallel to its plane and constitutes, preferentially, all or part of the front surface of the housing 205. A return spring 225 pushes the surface 210 towards the exterior of the housing 205.

The light rays emission means 215 and the reception means 220 constitute, jointly, a single optical component and are positioned either side of a narrow passage into which, when the surface 220 is pressed, is sunk an opaque part linked to the surface 210, constituting the modulation means 225, parallel to the direction of displacement of the surface 210 and perpendicular to the plane of the surface 210.

Between the emission means 215 and the reception means 220, the modulation means 225 thus comprises, here, the opaque part linked to the surface 210 which gradually blocks the optical path between the emitter 215 and the receptor 220.

When the surface 210 is moved, the reception means 220 of light rays receives light rays modulated by the modulation means 225. As a result of the geometry of the positions of the emitter 215, the part linked to the surface 210 and the position of the reception means 220, the intensity of the signal coming out of the reception means 220 is greatest when there has been no push on the surface 210. When there is a push on this surface 210, the modulation is a reduction in the intensity of light received by the reception means 220 and, consequently, a reduction in the intensity of the electrical signal coming from the reception means 220. This reduction having a unique relationship to the deformation of the surface 210, the processing circuit 230 of the signal coming from the reception means 220 can measure the force exerted on the front surface and trigger an alarm signal transmitted to the central station 250 when the intensity of the signal transmitted by the reception means 220 becomes less than a predetermined value corresponding to a standardized pressure (in accordance with the regulations in force, for example European regulations).

To avoid any disturbance from stray light, the light emitted by the emitter 215 is preferentially variable, for example in the form of pulses, i.e. the intensity of light takes two values alternately, for example zero and nominal. Thus, the processing circuit 230 can measure the stray light and deduct it from the light received.

Once an alarm signal has been transmitted to the central station 250, the processing circuit 230 waits to receive, from the central station 250, a signal acknowledging receipt of the alarm and then triggers a change to the visible state of the warning device 235. For example, the warning device 235 is a light-emitting diode located on the front surface of the housing 205 that is lit intermittently by the processing circuit 230 after receipt of the acknowledgement of receipt from the central station 250.

For resetting, in the embodiment shown in FIG. 2, in the processing circuit 230, different methods are provided that can be utilized alternately.

Firstly, the processing circuit 230 is adapted to communicate with the central station 250 and to receive, from the central station 250, a reset instruction. On receiving this instruction, the processing circuit 230 sets the warning device 235 to its initial appearance and returns an acknowledgement of receipt for the reset instruction to the central station 250.

Secondly, the signal processing circuit 230 is adapted to measure the length of time elapsed since a manual activation and, when said length of time is greater than a predetermined length of time, for example two hours, it sets the warning device 235 to its initial appearance and transmits a message, to the central station 250, indicating the resetting of the manual trigger device 200.

Finally, the signal processing circuit 230 is adapted to measure the length of time elapsed since a manual activation and, when said length of time is greater than a predetermined length of time, for example fifteen seconds, it sets the warning device 235 to its initial appearance and transmits a message, to the central station 250, indicating the resetting of the manual trigger device 200.

The signal processing circuit 230 is adapted to test the reception of light rays by the reception means 220. To this end, the signal processing circuit modulates, during test phases, for example daily, the power-supply signal of the emission means 215, for example in the form of saw-tooth wave signals and measures the intensity of the signal emitted by the reception means 220. When the drift of the response from the reception means 220 (peak value) and the impact of the stray light (minimum value of the intensity of the signal emitted by the reception means) are limited (for example, less than one-thirds), the processing circuit 230 can compensate for this drift by modifying the detection threshold. However, when the drift or the impact of the stray light is greater than a predetermined value, for example one-third, the processing circuit 230 emits a signal, to the central station 250, indicating a malfunction of the manual trigger device 200.

It is noted that the increase in the impact of the stray light can be caused by a fracture of the housing 205 or the surface 210 while the drift of the device's response can be caused by the presence of dust in the optical system.

FIG. 3 shows a manual trigger device 300 comprising the same components as the device 100 shown in FIG. 1. Only the signal processing circuit 330 is different from the signal processing circuit 130.

For resetting, in the embodiment shown in FIG. 3, the signal processing circuit 330 is adapted to detect a modulation of the light rays representative of a pull on the flexible surface 110 with predetermined pull strength. To this end, the modulation exerted by the displacement of the flexible surface 110 is univalent, on both sides of its rest position. Unlike the embodiment shown in FIG. 1, this rest position does not therefore correspond to the maximum transmission between the light-emitting diode 115 and the reception means 120.

When detection of the pull on the flexible surface 110 with a predetermined pull strength has occurred, the processing circuit 330 sets the warning device 135 to its initial appearance and transmits a message, to the central station 150, indicating the resetting of the manual trigger device 300.

It is noted that the pull on the surface can be exerted by means of a suction pad or a magnet, depending on the material and the surface state of the surface 110.

This invention is not restricted to the embodiments described and shown. On the contrary, any combination of the different embodiments described with regard to FIGS. 1 to 3 make it possible to constitute a specific embodiment of the device that is the subject of the present invention. For example, the different shapes and movements of the flexible and mobile surfaces, the different modulation means, the different means of resetting, testing or communicating with the central station can be exchanged in order to realize other specific embodiments of the device that is this subject of the present invention.

FIG. 4 shows different steps utilized in a specific embodiment of the method that is the subject of the present invention.

During a step 400, the emission of light rays is induced.

During a step 410, a modulation of the light rays emitted by the emission means is performed in order that, when the flexible or mobile surface is deformed or moved, the signal emitted during the reception step 420 is modulated, i.e. modified with respect to what it is when the flexible or mobile surface is at rest.

During a step 420, the light rays emitted during the emitting step are received and a signal is emitted representative of the light rays received.

During a step 430, the signal representative of the light rays received is processed in order to detect a modulation of the light rays representative of a push on the flexible or mobile surface with a predetermined pressure and, once detection has occurred, to command the local or remote transmission of an alarm signal and the change in appearance of a warning device visible from the outside of the housing.

During a step 440, the warning device is set to its initial appearance and the manual trigger device is reset.

FIG. 5 shows a manual trigger device 500 comprising:

a housing 505 presenting a flexible or mobile surface 510, an electromagnetic field emission means that emits an electromagnetic field 515, an electromagnetic field reception means 520 that receives the electromagnetic field emitted by the emission means 515 adapted to emit a signal representative of the electromagnetic field it receives, an electromagnetic field modulation means 525 that modulates the electromagnetic field emitted by the emission means connected to the surface 510 in order that, when the surface 510 is deformed or moved, the electromagnetic field reception means 520 receives an electromagnetic field modulated by the modulation means 525 and a processing circuit 530 that processes the signal emitted by the electromagnetic field reception means 520 adapted to detect a modulation of the electromagnetic field representative of a push on the surface 510 with a predetermined pressure and a warning device 535 visible from the outside of the housing 505 controlled by the processing circuit 530.

The housing 505 is of a known type. It is connected to a central station (not shown), through the intermediary of a wire or wireless connection 550. It is generally fixed on a wall. The surface 510 is, in this embodiment, flexible and elastic and constitutes, preferentially, all or part of the front surface of the housing 505.

The electromagnetic field emission means 515 and the electromagnetic field reception means 520 constitute jointly, in this embodiment described in FIG. 5, a condenser of which the capacitance is representative of the deformation of the flexible or mobile surface 510 of housing 505.

To this end, the deformation of the flexible or mobile surface 505 modifies the geometry of the condenser formed by the emission means 515 and the reception means 520 or induces the displacement of a part between the terminals of this condenser. This part is, for example, of the same type as those used in variable condensers. This part or the means of deformation of the condenser therefore form part of the modulation means 525.

Thus, the deformation of the flexible or mobile surface 510 modifies the electrical properties of the condenser and varies its capacitance. For example, this condenser is inserted in a resistance and impedance resonant circuit of known type, where the resonance frequency varies with the condenser's capacitance.

In this embodiment, unlike the embodiments described with respect to FIGS. 1 to 3, it is not necessary to utilize a transducer, for example electro-optical or opto-electronic (a light-emitting diode and a light-sensitive component, for example).

When the surface 510 is deformed or moved, the electromagnetic field reception means 520 receives an electromagnetic field modulated by the modulation means 525. As a result of the capacitance variation of the condenser formed by the modulation means and the reception means, the intensity and the frequency of the signal coming from the resonant circuit is greatest when there has been no push on this surface 510 and diminishes when there is a push on this surface 510. This reduction being representative of the deformation of the surface 510, the processing circuit 530 of the signal coming from the reception means can measure the force exerted on the front surface and trigger an alarm signal transmitted to the central station 550 when the intensity of the signal transmitted by the reception means 520 becomes less than a predetermined value corresponding to a standardized pressure (in accordance with the regulations in force, for example European regulations).

Once an alarm signal has been transmitted to the central station 550, the processing circuit 530 waits to receive, from the central station 550, a signal acknowledging receipt of the alarm and then triggers a change to the visible state of the warning device 535. For example, the warning device 535 is a light-emitting diode located on the front surface of the housing 505 that is lit intermittently by the processing circuit 530 after receipt of the acknowledgement of receipt from the central station 550.

It is provided that, in the embodiment shown in FIG. 5, the resetting will be automatically carried out after a predetermined length of time following activation.

The signal processing circuit 530 is adapted to test the reception of the electromagnetic field by the reception means 520. To this end, the signal processing circuit modulates, during test phases, for example daily, the power-supply signal of the condenser, for example in the form of saw-tooth wave signals and measures the intensity of the signal emitted by the reception means 520. When the drift of the condenser's response is limited (for example, less than one-third), the processing circuit 530 can compensate for this drift by modifying the detection threshold. However, when the drift is greater than a predetermined value, for example one third, the processing circuit 530 emits a signal, to the central station 550, indicating a malfunction of the manual trigger device 500.

It is noted that the logic diagram in FIG. 4 applies to the embodiment of the present invention shown in FIG. 5, by changing the terms "light rays" to "electromagnetic field", steps 410, 4230, 440 and 450, or "capacitance", step 420.

It is noted that light is a special case of an electromagnetic field, the present invention not therefore limited to the case of the modulation of light according to the position of a surface of the device's housing but, on the contrary, extends to all cases of the modulation of any type of electromagnetic field, in particular electrostatic or magnetic, according to this position.

The invention claimed is:

1. A manual trigger device, that comprises:

a housing presenting a flexible or mobile surface, means for generating an electromagnetic field;

means for sensing an electromagnetic field that senses the electromagnetic field emitted by the means for generating adapted to generate a signal representative of the sensed electromagnetic field;

means for modulating an electromagnetic field that modulates the electromagnetic field emitted by the means for generating connected to the flexible or mobile surface of the housing in order that, when the flexible or mobile surface is deformed or moved, the means for sensing senses an electromagnetic field modulated by the means for modulating according to the deformation or movement of the flexible or mobile surface; and a processing circuit that processes the signal emitted by the means for sensing adapted to detect a modulation of the electromagnetic field representative of a push on the flexible or mobile surface with a predetermined pressure and to command, once detection has occurred, a change in appearance of a warning device visible from an outside of the housing, wherein the processing circuit is adapted to command the change in the state of the warning device after emitting an alert message to a central station and receiving a message acknowledging receipt from the central station.

2. The manual trigger device according to claim 1, wherein the means for modulating is adapted to continuously modulate the electromagnetic field emitted by the means for generating in order that, when the flexible or mobile surface is deformed or moved, the means for sensing senses an electromagnetic field continually modulated by the modulation means.

3. The manual trigger device according to claim 1, wherein the means for generating and the means for sensing jointly form a condenser, the deformation of the flexible or mobile surface modifying electrical properties of said condenser and varying a capacitance of the condenser.

4. The manual trigger device according to claim 1, wherein the processing circuit comprises a means for magnetization adapted to change configuration during activation and to reset the device and resume an initial configuration when a magnetic key is utilized.

5. The manual trigger device according to claim 1, wherein the warning device is mechanically linked to the means for magnetization.

6. The manual trigger device according to claim 1, wherein the processing circuit is adapted to communicate with a central station and to receive a reset instruction from the central station, the processing circuit being adapted to reset itself and set the warning device to an initial appearance on reception of the reset instruction.

7. The manual trigger device according to claim 1, wherein the signal processing circuit is adapted to measure a length of time elapsed since a manual activation, then to reset and return the warning device to an initial appearance when said length of time is greater than a predetermined length of time.

8. The manual trigger device according to claim 1, wherein the signal processing circuit is adapted to test the detection of an electromagnetic field by the means for sensing and, if there is no detection, to emit an alert signal indicating a malfunction of the device.

9. The manual trigger device according to claim 1, wherein the signal processing circuit is adapted to measure a length of time of a manual activation, then to reset and return the warning device to an initial appearance when said length of time is greater than a predetermined length of time.

10. The manual trigger device according to claim 1, wherein the signal processing circuit is adapted to detect a modulation of the electromagnetic field representative of a pull on the flexible or mobile surface with predetermined pull strength and to reset and return the warning device to an initial appearance when detection of the pull has occurred.

11. A manual trigger device, comprising:

means for emitting light rays;

means for receiving light rays that receives light rays emitted by the means for emitting adapted to emit a signal representative of the light rays received;

means for modulating light rays that modulates the light rays emitted by the means for emitting connected to a flexible or mobile surface of a housing in order that, when the flexible or mobile surface is deformed or moved, the means for receiving light rays receives light rays modulated by the means for modulating; and a processing circuit that processes the signal emitted by the means for receiving light rays adapted to detect a modulation of the light rays representative of a push on the flexible or mobile surface with a predetermined pressure and to command, once detection has occurred, a change in appearance of a warning device visible from the outside of the housing, wherein the processing circuit is adapted to command the change in the state of the warning device after emitting an alert message to a central station and receiving a message acknowledging receipt from the central station.

12. The manual trigger device according to claim 11, wherein the means for modulating is adapted to continuously modulate the light rays emitted by the means for emitting in order that, when the flexible or mobile surface is deformed or moved, the means for receiving receives light rays continually modulated by the modulation means.

13. The manual trigger device according to claim 11, wherein the means for emitting light rays comprises a light-emitting diode.

14. The manual trigger device according to claim 11, wherein the means for modulating light rays comprises an interior surface of the flexible or mobile surface, on which the light rays emitted by the means for emitting are reflected towards the means for receiving.

15. The manual trigger device according to claim 11, wherein the means for modulating light rays comprises an opaque component set in movement by the deformation or displacement of the flexible or mobile surface in order to be positioned between the means for emitting light rays and the means for receiving light rays.

16. The manual trigger device according to claim 11, wherein the means for receiving light rays comprises a photosensitive semi-conductor component.

17. A manual trigger method, comprising:

a step of generating an electromagnetic field;

a step of sensing the electromagnetic field generated during the generating step, during which a signal is emitted representative of the sensed electromagnetic field;

a step of modulating the generated electromagnetic field in order that, when a flexible or mobile surface is deformed or moved, the signal emitted during the step of sensing is modulated;

a step of processing the signal representative of the sensed electromagnetic field in order to detect a modulation of the electromagnetic field representative of a push on the flexible or mobile surface with a predetermined pressure and to command, once detection has occurred, the change in appearance of a warning device visible from the outside of the housing;

a step of emitting an alert message to a central station;

a step of receiving a message acknowledging receipt from the central station; and a step of commanding a change in state of the warning device after receiving said acknowledging message from the central station.

18. The manual trigger process according to claim 17, wherein the electromagnetic field is a propagation of light.

* * * * *